(12) United States Patent
Shirasaki

(10) Patent No.: US 6,700,789 B2
(45) Date of Patent: Mar. 2, 2004

(54) HIGH-FREQUENCY WIRING BOARD

(75) Inventor: Takayuki Shirasaki, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/338,183

(22) Filed: Jan. 6, 2003

(65) Prior Publication Data

US 2003/0133279 A1 Jul. 17, 2003

(30) Foreign Application Priority Data

Jan. 7, 2002 (JP) ...................... P2002-000847

(51) Int. Cl.$^7$ .................. H05K 1/00; H05K 1/18; H05K 7/02; H05K 7/06; H05K 7/08
(52) U.S. Cl. ............. 361/748; 361/794; 361/795; 361/780; 361/750; 361/751; 361/760; 174/255; 174/256
(58) Field of Search ............... 361/748, 736, 361/780, 794, 795, 750, 751, 760; 174/255, 256

(56) References Cited

U.S. PATENT DOCUMENTS

| | | | | |
|---|---|---|---|---|
| 5,010,641 A | * | 4/1991 | Sisler | 29/830 |
| 5,396,397 A | * | 3/1995 | McClanahan et al. | 361/313 |
| 5,662,816 A | * | 9/1997 | Andry | 216/18 |
| 5,708,569 A | * | 1/1998 | Howard et al. | 361/760 |
| 6,097,260 A | * | 8/2000 | Whybrew et al. | 333/1 |
| 6,160,715 A | * | 12/2000 | Degani et al. | 361/767 |
| 6,236,572 B1 | * | 5/2001 | Teshome et al. | 361/794 |
| 6,281,844 B1 | * | 8/2001 | Kodim et al. | 343/700 MS |
| 6,369,336 B1 | * | 4/2002 | Obata | 174/266 |
| 6,483,714 B1 | * | 11/2002 | Kabumoto et al. | 361/760 |
| 6,487,083 B1 | * | 11/2002 | Kwong | 361/761 |

FOREIGN PATENT DOCUMENTS

| | | |
|---|---|---|
| JP | 1-168093 | 7/1989 |
| JP | 5-206678 | 8/1993 |
| JP | 6-085099 | 3/1994 |

* cited by examiner

Primary Examiner—David Martin
Assistant Examiner—Thanh Yen Tran
(74) Attorney, Agent, or Firm—Hogan & Hartson

(57) ABSTRACT

There has been a problem that a mode (a high-order mode) different from a basic propagation mode occurs at a point of a through conductor and a transmission characteristic deteriorates greatly. The present invention is a high-frequency wiring board wherein $L > \lambda/4$ and $\pi(A+B) \leq \lambda$ are satisfied in which L is a length of a through conductor, A is a diameter of the through conductor, B is shortest distances between the through conductor and a plurality of ground through conductors, $\pi$ is a circle ratio and $\lambda$ is an effective wavelength of a high-frequency signal transmitted by the through conductor. It is possible to inhibit a high-order mode which occurs at a point of the through conductor.

5 Claims, 4 Drawing Sheets

HIGH-FREQUENCY WIRING BOARD

BACKGROUND OF THE INVENTION

1. Field of the Invention

The present invention relates to a high-frequency wiring board for connecting and mounting a high-frequency integrated circuit or a high-frequency circuit device such as an IC and an LSI used in a high-frequency region of a millimeter waveband of 30 GHz or more, and more specifically, relates to a high-frequency wiring board which has a through conductor for signal transmission with an improved high-frequency signal transmission characteristic.

2. Description of the Related Art

As a conventional high-frequency wiring board which transmits a high-frequency signal, there is one which is shown in a section view of FIG. 7 and a plan view of FIG. 8, for example.

In FIGS. 7 and 8, reference numeral 21 denotes a high-frequency wiring board, reference numerals 22a to 22d denote dielectric layers, a first line conductor 23 and a second line conductor 24 are disposed to main faces 29a, 29b of the high-frequency wiring board 21, and one ends of the first and second line conductors 23, 24 are electrically connected to each other by a through conductor 25. Moreover, ground conductors 26 and same plane ground conductors 28 are disposed to main faces of the dielectric layers 22a to 22d, and the ground conductors 26 and the same plane ground conductors 28 are electrically connected by a plurality of ground through conductors 27.

More specifically, the high-frequency wiring board 21 comprises a dielectric board 22, the first line conductor 23, the second line conductor 24, the through conductor 25, the ground conductors 26, the ground through conductors 27 and the same plane ground conductors 28. The dielectric board 22 is formed by laminating the dielectric layers 22a, 22b, 22c, 22d. The first line conductor 23 is disposed onto the main face 29a of the dielectric layer 22a, which is a top face of the high-frequency wiring board 21, and the second line conductor 24 is disposed onto the main face 29b of the dielectric layer 22d, which is a bottom face of the high-frequency wiring board 21. One end 23a of the first line conductor 23 and one end 24a of the second line conductor 24 overlap each other when viewed from a thickness direction of the dielectric layers 22a to 22d, and the one ends 23a, 24a are electrically connected to each other by the through conductor 25 piercing the dielectric layers 22a to 22d. On the respective main faces defining interlayer border planes of the dielectric layers 22a to 22d, ground conductors 26 formed so as to surround the through conductor 25 are disposed with specified spaces to the through conductor 25. The same plane ground conductors 28 which are formed with a specified space from the first line conductor 23 on the main face 29a of the dielectric layer 22a with the first line conductor 23 formed and formed with a specified space from the second line conductor 24 on the main face 29b of the dielectric layer 22d with the second line conductor 24 formed are disposed. The ground conductors 26 and the same plane ground conductors 28 are electrically connected by the ground through conductors 27.

This high-frequency wiring board has a problem that because a frequency of a high-frequency signal becomes higher in recent years, unnecessary radiation of a high-frequency signal occurs from between the ground through conductors 27, with the result that radiation loss of a high-frequency signal increases and a transmission characteristic deteriorates.

Hence, as a technique of inhibiting unnecessary radiation of a high-frequency signal from between the ground through conductors 27, such a technique that, by setting the number of the ground through conductors 27 formed so as to surround the through conductor 25 to five or more, enables decrease of radiation loss of a high-frequency signal and improvement of a high-frequency signal transmission characteristic is proposed, for example (refer to Japanese Unexamined Patent Publication JP-A 5-206678 (1993)).

However, the above conventional high-frequency wiring board has a problem that although unnecessary radiation of a high-frequency signal from between the ground through conductors is inhibited as a result of increasing the number of the ground through conductors, a wavelength is short in a high-frequency region of a millimeter waveband, and therefore, a mode (a high-order mode) different from a basic propagation mode occurs at a point of the through conductor in a case where the length of the through conductor is $\lambda/4$ or more, with the result that a transmission characteristic deteriorates greatly as a frequency becomes higher.

SUMMARY OF THE INVENTION

The invention was made in view of the above problems, and an object of the invention is to provide a high-frequency wiring board which is capable of inhibiting a high-order mode occurring at a point of a through conductor and enables obtaining a good transmission characteristic in a high-frequency signal of a millimeter waveband of 30 GHz or more.

The invention provides a high-frequency wiring board comprising:

a dielectric board formed by laminating a plurality of dielectric layers;

a first line conductor formed on a main face of one dielectric layer of the dielectric board;

a second line conductor formed on a main face of another dielectric layer of the dielectric board;

a through conductor for electrically connecting one end of the first line conductor to one end of the second line conductor by piercing the dielectric layers between the first line conductor and the second line conductor;

same plane ground conductors which are formed with a specified space from the first line conductor on the main face of the dielectric layer on which main face the first line conductor is formed and are formed with a specified space from the second line conductor on the main face of the dielectric layer on which main face the second line conductor is formed;

ground conductors formed on the main faces of the dielectric layers between the first line conductor and the second line conductor so as to surround the through conductor; and a plurality of ground through conductors which are formed on the dielectric layers so as to surround the through conductor and which electrically connect the same plane ground conductors and the ground conductors, wherein $L > \lambda/4$ and $\pi(A+B) \leq \lambda$ are satisfied in which L is a length of the through conductor, A is a diameter of the through conductor, B is shortest distances between the through conductor and the ground through conductors, $\pi$ is a circle ratio and $\lambda$ is an effective wavelength of a high-frequency signal transmitted by the through conductor.

According to the invention, as described above, a diameter A and length L of the through conductor and shortest distances B between the through conductor and the ground through conductors are set within specified ranges with respect to an effective wavelength λ of a high-frequency signal, so that even in the case of a long through conductor with a length of λ/4 or more, distances between the through conductor and the ground through conductors are short enough with respect to an effective wavelength of a high-frequency signal, a standing wave and the like between the through conductor and the ground through conductors is hard to occur, it is possible to inhibit occurrence of a high-order mode at a point of the through conductor also in a high-frequency region of a millimeter waveband, and consequently, it is possible to realize a good transmission characteristic in a high-frequency signal of a millimeter waveband.

Further, in the invention it is preferable that in the above construction, a distance H between the ground conductor and the same plane ground conductor is equal to or less than λ/2.

According to the invention, as a result that distances between the ground conductors and the same plane ground conductors, that is, connection lengths of the ground through conductors electrically connecting the ground conductors and the same plane ground conductors are made to be short enough with respect to a wavelength of a high-frequency signal, it is possible to inhibit potential distribution which occurs in the respective ground through conductors, so that it is possible to stabilize ground potential of the ground through conductors, and consequently, it is possible to realize a good transmission characteristic in a high-frequency signal of a millimeter waveband.

Still further, in the invention it is preferable that in the above respective constructions, a distance P between centers of the ground through conductors is equal to or less than λ/4.

According to the invention, a distance between the centers of the ground through conductors is short enough with respect to an effective wavelength of a high-frequency signal, it is possible to inhibit spread of an electromagnetic field from between the ground through conductors, and therefore, it is possible to further inhibit unnecessary radiation of a high-frequency signal from between the ground through conductors, with the result that it is possible to realize a good transmission characteristic in a high-frequency signal of a millimeter waveband.

In the invention it is preferable that a frequency of the high-frequency signal is within a range from 30 GHz to 100 GHz.

As described above, according to the invention, it is possible to provide a high-frequency wiring board which is capable of inhibiting a high-order mode occurring at a point of the through conductor and enables obtaining a good transmission characteristic in a high-frequency signal of a millimeter waveband of 30 GHz or more.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
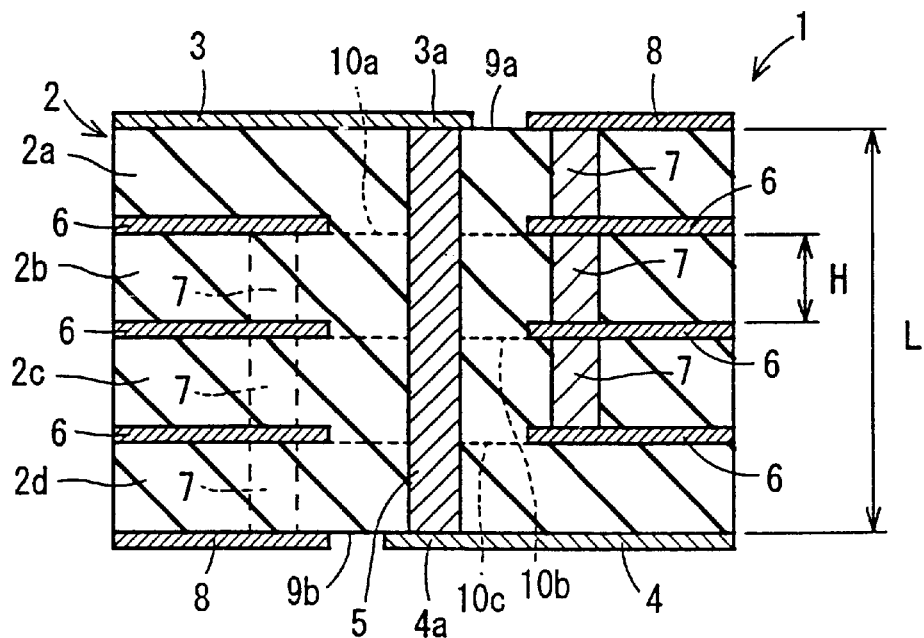
FIG. 1 is a section view showing one embodiment of a high-frequency wiring board of the present invention.

Now referring to the drawings, preferred embodiments of the invention are described below.

Figure 2:
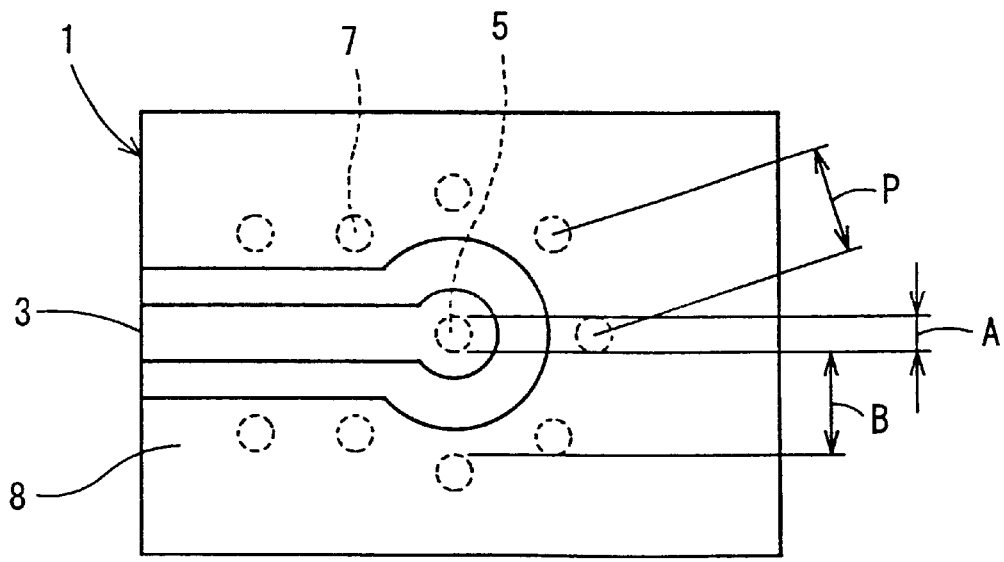
FIG. 2 is a plan view showing the one embodiment of the high-frequency wiring board of the invention.

FIG. 1 is a section view showing one embodiment of a high-frequency wiring board of the present invention, and FIG. 2 is a plan view showing the one embodiment of the high-frequency wiring board of the invention, which shows a face on a first line conductor side of a dielectric board. A high-frequency wiring board 1 comprises a dielectric board 2, a first line conductor 3, a second line conductor 4, a through conductor 5, ground conductors 6, same plane ground conductors 8 and ground through conductors 7. The dielectric board 2 is formed by laminating a plurality of (four in the embodiment) dielectric layers 2a, 2b, 2c, 2d. The first line conductor 3 is disposed onto a main face 9a of the dielectric layer 2a, which is a top face of the high-frequency wiring board 1, and the second line conductor 4 is disposed onto a main face 9b of the dielectric layer 2d, which is a bottom face of the high-frequency wiring board 1. One end 3a of the first line conductor 3 and one end 4a of the second line conductor 4 overlap each other when viewed from a thickness direction of the dielectric layers 2a to 2d, and the one ends 3a, 4a are electrically connected to each other by the through conductor 5 piercing the dielectric layers 2a to 2d. On the respective main faces defining interlayer border planes 10a, 10b, 10c of the dielectric layers 2a to 2d, the ground conductors 6 formed so as to surround the through conductor 5 are disposed with specified spaces to the through conductor 5. The same plane ground conductors 8 are formed with a specified space from the first line conductor 3 on the main face 9a of the dielectric layer 2a with the first line conductor 3 formed, and formed with a specified space from the second line conductor 4 on the main face 9b of the dielectric layer 2d with the second line conductor 4 formed. The ground conductors 6 and the same plane ground conductors 8 are electrically connected by the ground through conductors 7 piercing the dielectric layers 2a to 2d. The ground through conductors 7 are formed on the dielectric layers 2a to 2d so as to surround with specified spaces to the through conductor 5.

In the high-frequency wiring board 1 of the invention, as shown in FIGS. 1 and 2, it is important that L>λ/4 and π(A+B)≦λ are satisfied in which L is a length of the through conductor 5, A is a diameter of the through conductor 5, B is shortest distances between the through conductor 5 and the ground through conductors 7, π is a circle ratio and λ is an effective wavelength of a high-frequency signal transmitted by the through conductor 5. By such a construction, even in the case of a long through conductor 5 with a length longer than λ/4, distances between the through conductor 5 and the ground through conductors 7 are short enough with respect to an effective wavelength of a high-frequency signal, a standing wave and so on between the through conductor 5 and the ground through conductors 7 is hard to occur, it is possible to inhibit a high-order mode occurring at a point of the through conductor, which is a problem in a high-frequency region of a millimeter waveband, and consequently, it is possible to realize a good transmission characteristic in a high-frequency signal of a millimeter waveband.

Moreover, as shown in FIG. 1, it is preferable that a distance H between the ground conductor 6 and the same plane ground conductor 8 is $\lambda/2$ or less. According to such a construction, as a result that connection lengths of the ground through conductors 7 electrically connecting the ground conductors 6 and the same plane ground conductors 8 are made to be short enough with respect to the wavelength $\lambda$ of a high-frequency signal, it is possible to inhibit potential distribution occurring in the respective ground through conductors 7, and therefore, it is possible to stabilize ground potential of the ground through conductors 7, with the result that it is possible to realize a good transmission characteristic in a high-frequency signal of a millimeter waveband.

Furthermore, as shown in FIG. 2, it is preferable that a distance P between centers of the ground through conductors 7 is $\lambda/4$ or less. According to such a construction, since a distance between the centers of the ground through conductors 7 is short enough with respect to an effective wavelength of a high-frequency signal and it is possible to inhibit spread of an electromagnetic field from between the ground through conductors 7, it is possible to further inhibit unnecessary radiation of a high-frequency signal from between the ground through conductors 7, with the result that it is possible to realize a good transmission characteristic in a high-frequency signal of a millimeter waveband.

Figure 3:
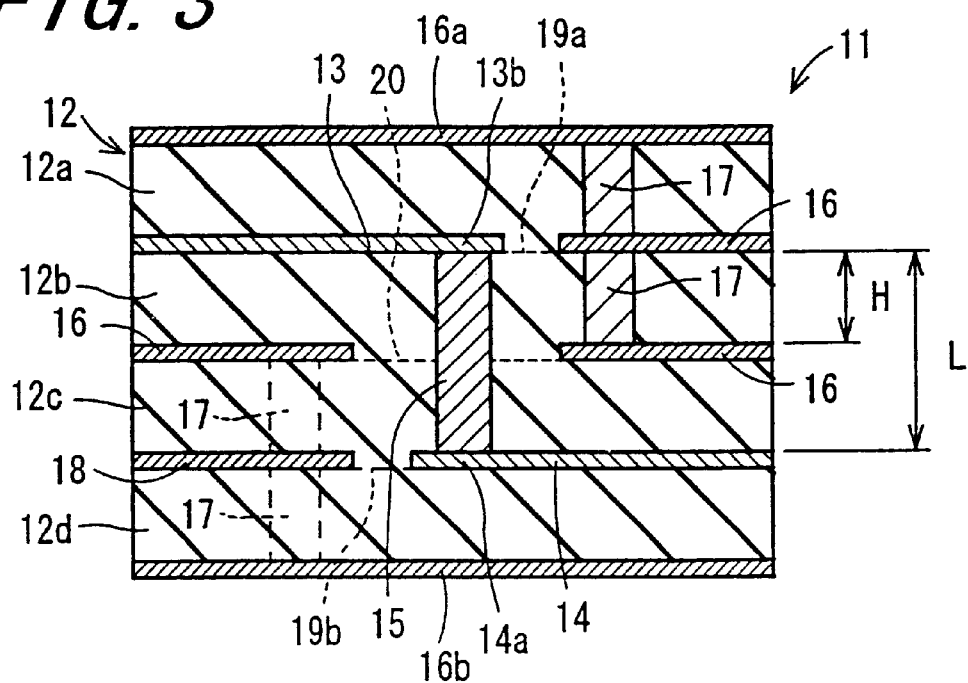
FIG. 3 is a section view showing another embodiment of the high-frequency wiring board of the invention.
Figure 4:
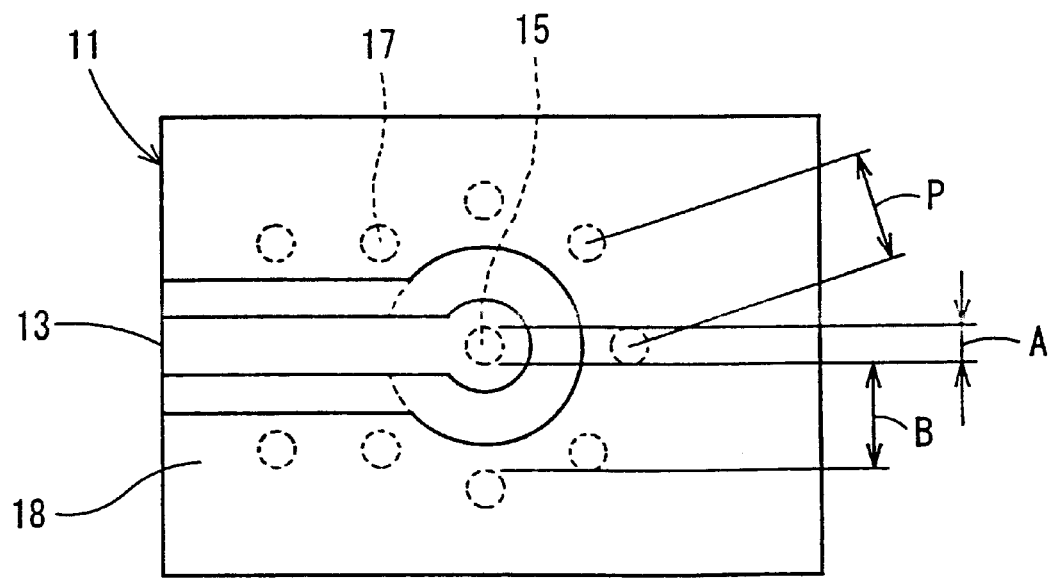
FIG. 4 is a plan view showing the other embodiment of the high-frequency wiring board of the invention.

FIG. 3 is a section view showing another embodiment of the high-frequency wiring board of the invention, and FIG. 4 is a plan view showing the other embodiment of the high-frequency wiring board of the invention, which shows a face on a first line conductor side of a dielectric board. A high-frequency wiring board 11 comprises a dielectric board 12, a first line conductor 13, a second line conductor 14, a through conductor 15, a ground conductor 16, same plane ground conductors 18 and ground through conductors 17. The dielectric board 12 is formed by laminating a plurality of (four in the embodiment) dielectric layers 12a, 12b, 12c, 12d. The first line conductor 13 is disposed onto a main face 19a of the dielectric layer 12b, which defines an interlayer border plane of the adjacent dielectric layers 12a, 12b, and the second line conductor 14 is disposed onto a main face 19b of the dielectric layer 12d, which defines an interlayer border plane of the adjacent dielectric layers 12c, 12d. One end 13a of the first line conductor 13 and one end 14a of the second line conductor 14 overlap each other when viewed from a thickness direction of the dielectric layers 12a to 12d, and the one ends 13a, 14a are electrically connected to each other by the through conductor 15 piercing the dielectric layers 12b, 12c. On a main face of the dielectric layer 12c which defines an interlayer border plane 20 of the dielectric layers 12b, 12c, the ground conductor 16 formed so as to surround the through conductor 15 is disposed with a specified space to the through conductor 15. In other words, the ground conductor 16 is formed on the main face of the dielectric layer 12c between the first line conductor 13 and the second line conductor 14. On the other main face of the dielectric layer 12a, which is a top face of the high-frequency wiring board 11, another ground conductor 16a is disposed. On the other main face of the dielectric layer 12d, which is a bottom face of the high-frequency wiring board 11, still another ground conductor 16b is disposed. The same plane ground conductors 18 are formed with a specified space from the first line conductor 13 on the main face 19a of the dielectric layer 12b with the first line conductor 13 formed, and formed with a specified space from the second line conductor 14 on the main face 19b of the dielectric layer 12d with the second line conductor 14 formed. The ground conductors 16, 16a, 16b and the same plane ground conductors 18 are electrically connected by the ground through conductors 17 piercing the dielectric layers 12a to 12d. The ground through conductors 17 are formed on the dielectric layers 12a to 12d so as to surround with specified spaces to the through conductor 15.

In the high-frequency wiring board of the invention, as shown in FIGS. 3 and 4, it is important that $L>\lambda/4$ and $\pi(A+B) \leq \lambda$ are satisfied in which L is a length of the through conductor 15, A is a diameter of the through conductor 15, B is shortest distances between the through conductor 15 and the ground through conductors 17, $\pi$ is a circle ratio and $\lambda$ is an effective wavelength of a high-frequency signal transmitted by the through conductor 15.

According to such a construction, even in the case of a long through conductor 15 with a length longer than $\lambda/4$, distances between the through conductor 15 and the ground through conductors 17 are short enough with respect to an effective wavelength of a high-frequency signal, a standing wave and so on between the through conductor 15 and the ground through conductors 17 is hard to occur, it is possible to inhibit a high-order mode occurring at a point of the through conductor, which is a problem in a high-frequency region of a millimeter waveband, and consequently, it is possible to realize a good transmission characteristic in a high-frequency signal of a millimeter waveband.

Moreover, as shown in FIG. 3, it is preferable that a distance H between the ground conductor 16 and the same plane ground conductor 18 is $\lambda/2$ or less. According to such a construction, as a result that connection lengths of the ground through conductors 17 electrically connecting the ground conductors 16 and the same plane ground conductors 18 are made to be short enough with respect to the wavelength $\lambda$ of a high-frequency signal, it is possible to inhibit potential distribution occurring in the respective ground through conductors 17, and therefore, it is possible to stabilize ground potential of the ground through conductors 17, with the result that it is possible to realize a good transmission characteristic in a high-frequency signal of a millimeter waveband.

Furthermore, as shown in FIG. 4, it is preferable that a distance P between the centers of the ground through conductors 17 is $\lambda/4$ or less. According to such a construction, a distance between the centers of the ground through conductors 17 is short enough with respect to an effective wavelength of a high-frequency signal, it is possible to inhibit spread of an electromagnetic field from between the ground through conductors 17, and therefore, it is possible to further inhibit unnecessary radiation of a high-frequency signal from between the ground through conductors 17, with the result that it is possible to realize a good transmission characteristic in a high-frequency signal of a millimeter waveband.

As a material of the dielectric layers 2a to 2d, 12a to 12d in the high-frequency wiring boards 1, 11 of the invention, a ceramics material such as alumina ($Al_2O_3$) ceramics and mullite ($3Al_2O_3 \cdot 2SiO_2$) ceramics, an inorganic material such as glass ceramics, or a resin material such as a fluorocarbon resin like a tetrafluoroethylene resin (polytetrafluoroethylene; PTFE), a tetrafluoroethylene-ethylene copolymer resin (ETFE) and a tetrafluoroethylene-perfluoroalkoxyethylene copolymer resin (a tetrafluoroethylene-perfluoroalkylvinylether copolymer resin; PFA), a glass epoxy resin, a polyphenylene ether resin, liquid crystal polyester and polyimide is used. Moreover, the shapes and dimensions (thickness, width and length) of the high-frequency wiring boards 1, 11 are set with reference to a frequency of a high-frequency signal to be used, characteristic impedance and so on.

The first line conductors 3, 13 and the second line conductors 4, 14 of the invention are made by a conductor layer of a metal material suitable for transmission of a high-frequency signal, for example, made by a Cu layer, an Mo—Mn layer, a W layer, an Mo—Mn metalize layer coated with an Ni plating layer and an Au plating layer, a W metalize layer coated with an Ni plating layer and an Au plating layer, a Cr—Cu alloy layer, a Cr—Cu alloy layer coated with an Ni plating layer and an Au plating layer, a Ta$_2$N layer coated with an Ni—Cr alloy layer and an Au plating layer, a Ti layer coated with a Pt layer and an Au plating layer, or an Ni—Cr alloy layer coated with a Pt layer and an Au plating layer, and formed by a thick film printing method, various kinds of thin film forming methods, a plating method or the like. The thickness and width thereof are also set with reference to a frequency of a high-frequency signal to be transmitted, characteristic impedance and so on.

Further, the ground conductors 6, 16, 16a, 16b and the same plane ground conductors 8, 18 can be formed by the same material and by the same method as the first line conductors 3, 13 and the second line conductors 4, 14, and spaces between the first and second line conductors 3, 13; 4, 14 and the ground conductors 6, 16, 16a, 16b are set in accordance with a frequency of a high-frequency signal to be transmitted, characteristic impedance and so on.

Still further, the through conductors 5, 15 are formed so as to electrically connect the first line conductors 3, 13 and the second line conductors 4, 14, and can be disposed by, for example, forming a through hole conductor or a via hole conductor or burying a metal plate, a metal bar, a metal pipe or the like.

Still further, the ground through conductors 7, 17 are formed so as to connect the ground conductors 6, 16, 16a, 16b and the same plane ground conductors 8, 18, and can be disposed by, for example, forming a through hole conductor or a via hole conductor or burying a metal plate, a metal bar, a metal pipe or the like.

In production of the high-frequency wiring boards 1, 11, for example, in a case where the dielectric layers 2a to 2d, 12a to 12d are made of alumina ceramics, green sheets of alumina ceramics which become the dielectric boards 2, 12 are prepared firstly, subjected to specified punching, and coated with conductor paste of W, Mo or the like by a screen printing method or the like. Secondly, the sheets are fired at 1600° C., and lastly, Ni plating and Au plating are applied on the respective conductor layers.

In the high-frequency wiring board of the invention, one quarter of an effective wavelength in a frequency less than 30 GHz is 0.85 mm or more, which is long, and therefore, a high-order mode is hard to occur in this frequency, so that a preferable frequency range of a high-frequency signal is 30 GHz or more. Moreover, although the upper limit of the frequency range of a high-frequency signal is not restricted specifically, a range of 100 GHz or less is practical in consideration of a use for millimeter wave radio communication to meet a recent processing technique and a recent request. In this frequency range, an effect of the invention is sufficiently obtained.

(Working Example)

Next, a working example of the high-frequency wiring board of the invention will be explained below.

In a high-frequency wiring board 1, on upper and lower faces 9a, 9b of a dielectric board 2 formed by laminating four layers including dielectric layers 2a to 2d made of alumina ceramics having a dielectric constant of 8.6 and a thickness of 0.2 mm, as a first line conductor 3 and a second line conductor 4, line conductors made by adhering an Ni plating layer and an Au plating layer on a W metalize layer having a line width of 0.12 mm are formed, respectively. Moreover, almost entirely on the upper and lower faces 9a, 9b of the dielectric board 2, as the same plane ground conductors 8, conductors made by adhering Ni plating layers and Au plating layers on W metalize layers are formed with spaces of 0.1 mm so that characteristic impedance of the first line conductor 3 and the second line conductor 4 becomes 50 Ω. A through conductor 5 which connects one end 3a of the first line conductor 3 to one end 4a of the second line conductor 4 is one which is made by W metalize and substantially circular in cross sectional shape with a diameter of 0.075 mm. On the respective main faces of the dielectric layers 2a to 2d between the first line conductor 3 and the second line conductor 4, so as to surround the through conductor 5 by a substantially round shape with a radius of 0.3 mm, ground conductors 6 are formed. A plurality of ground through conductors 7 which connect the ground conductors 6 and same plane ground conductors 8 are made by W metalize and substantially circular in cross sectional shape with a diameter of 0.075 mm, and placed so as to surround the through conductor 5 concentrically with a radius of 0.4 mm so that characteristic impedance becomes 50 Ω in cross section. Thus, a sample 1 of the high-frequency wiring board 1 of the invention is obtained.

Figure 7:
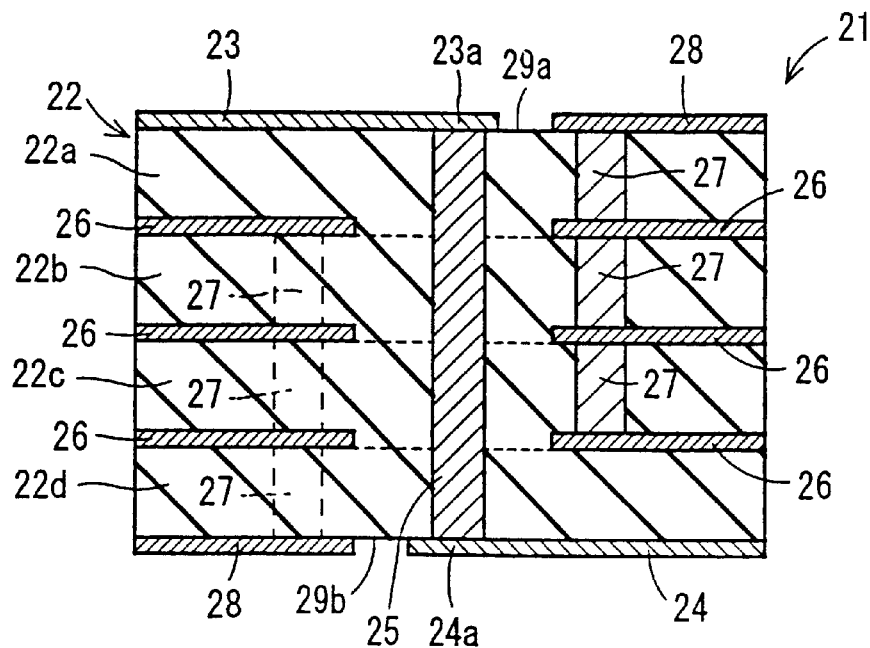
FIG. 7 is a section view showing one example of a conventional high-frequency wiring board.
Figure 8:
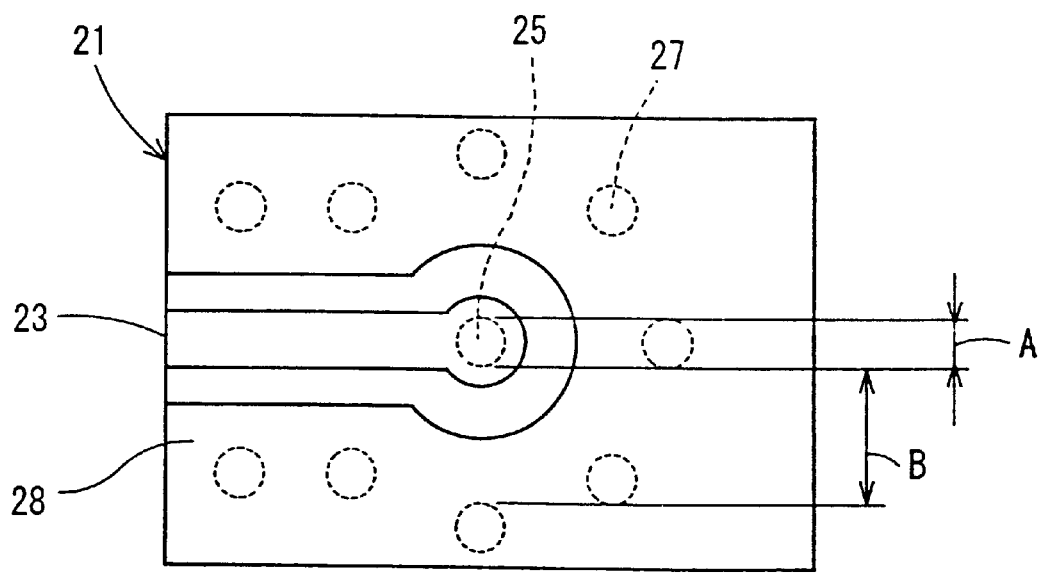
FIG. 8 is a plan view showing the one example of the conventional high-frequency wiring board.

On the other hand, as a comparison example, in the construction shown by a section view and a plan view in FIGS. 7 and 8, dielectric layers 22a to 22d, a first line conductor 23, a second line conductor 24, a through conductor 25, a ground conductor 26, a ground through conductor 27 and a same plane ground conductor 28 are formed in the same manner as in the sample 1. The through conductor 25 connecting one end 23a of the first line conductor 23 to one end 24a of the second line conductor 24 is made by W metalize and substantially circular in cross sectional shape with a diameter of 0.2 mm. Moreover, a plurality of ground through conductors 27 connecting the ground conductor 26 and the same plane ground conductor 28 are substantially circular in cross sectional shape with a diameter of 0.25 mm and made by W metalize, and placed so as to surround the through conductor 25 concentrically with a radius of 1.35 mm so that characteristic impedance becomes 50 Ω in cross section. Thus, a sample 2 of a high-frequency wiring board 21 of the comparison example is obtained.

These samples 1, 2 of the high-frequency wiring boards of the invention and the comparison example are connected to a network analyzer by the use of a wafer probe, and reflection loss and transmission loss to a high-frequency signal are measured. The result of reflection characteristics is shown in FIG. 5, and the result of transmission characteristics is shown in FIG. 6.

Figure 5:
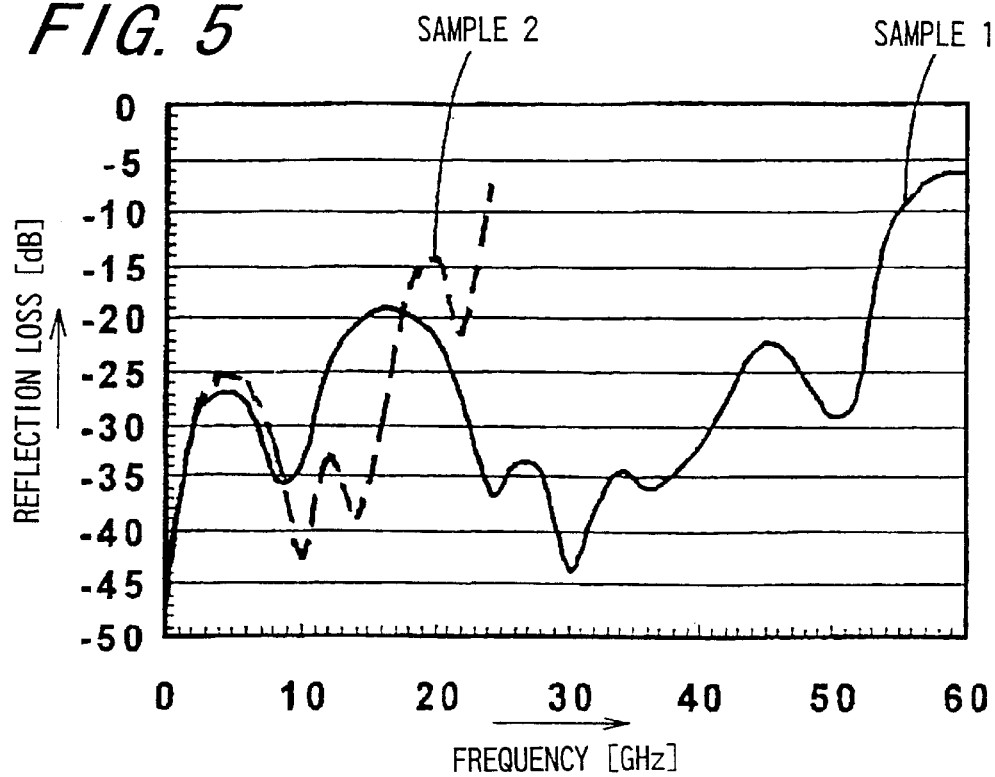
FIG. 5 is a graph showing frequency characteristics of reflection loss of a high-frequency signal regarding high-frequency wiring boards of a working example of the invention and a comparison example.
Figure 6:
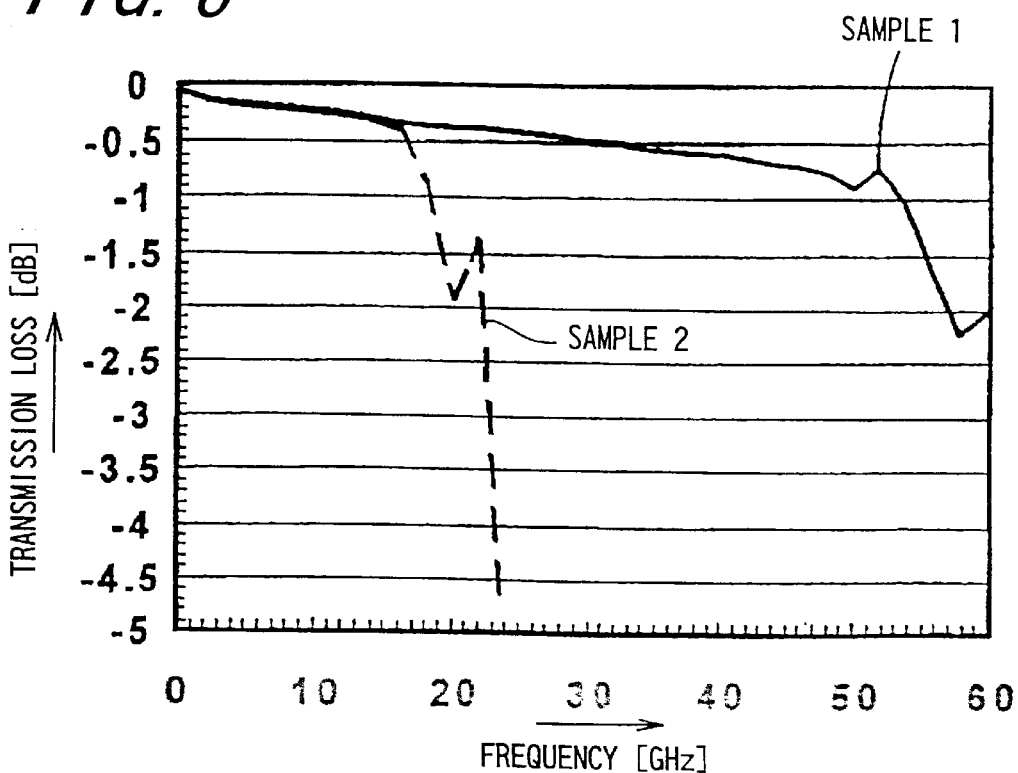
FIG. 6 is a graph showing frequency characteristics of transmission loss of a high-frequency signal regarding the high-frequency wiring boards of the working example of the invention and the comparison example.

FIG. 5 is a graph showing frequency characteristics of reflection loss in the samples 1, 2, where a frequency (unit: GHz) is shown on the lateral axis and reflection loss (unit:

dB) is shown on the longitudinal axis. Moreover, of characteristic curves, a solid line shows a frequency characteristic of reflection loss of the sample 1 and a dashed line shows that of the sample 2.

It is apparent from the result of FIG. 5 that the sample 1 of the working example of the invention realizes, up to a frequency of 50 GHz, a good frequency characteristic of reflection loss of −18 dB or less. By contrast, in the sample 2 of the comparison example, reflection loss increases at a frequency around 23 GHz, and a value thereof exceeds −10 dB. In the sample 1 of the working example of the invention, such characteristic deterioration is not recognized in a frequency range shown in the drawing, and a good characteristic is obtained.

On the other hand, FIG. 6 is a graph showing frequency characteristics of transmission loss in the samples 1, 2, where a frequency (unit: GHz) is shown on the lateral axis and a transmission loss (unit: dB) is shown on the longitudinal axis. Moreover, of characteristic curves, a solid line shows a frequency characteristic of transmission loss of the sample 1 and a dashed line shows that of the sample 2.

It is apparent from the result of FIG. 6 that in the sample 2 of the comparison example, transmission loss drastically increases around 23 GHz or more, whereas in the sample 1 of the working example of the invention, a good and flat characteristic is obtained over a wide band up to 50 GHz.

Therefore, according to the high-frequency wiring board 1 of the invention, $L>\lambda/4$ and $\pi(A+B) \leq \lambda$ are satisfied in which L is a length of the through conductor 5, A is a diameter of the through conductor 5, B is shortest distances between the through conductor 5, the ground through conductors 7, $\pi$ is a circle ratio and $\lambda$ is an effective wavelength of a high-frequency signal transmitted by the through conductor 5, whereby it can be confirmed that unnecessary radiation is a little even in a high-frequency signal of a millimeter waveband and a good transmission characteristic can be realized over a wide band.

Besides, regarding the sample 1, in the case of setting a distance H between the ground conductor 6 and the same plane ground conductor 8 to $\lambda/2$ or less, such a frequency characteristic that reflection loss is −15 dB or less and transmission loss is good and flat is obtained up to a frequency of 65 GHz, and further, in the case of setting a distance P between the ground through conductors 7 to $\lambda/4$ or less, such a frequency characteristic that reflection loss is −12 dB or less and transmission loss is good and flat is obtained up to a frequency of 80 GHz.

The invention is not restricted to the above embodiments, and various changes may be made without departing from the scope of the invention. For example, although the ground through conductors are formed so as to concentrically surround the through conductor in the above embodiments, the ground through conductors may be formed so as to rectangularly surround the through conductor.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A high-frequency wiring board comprising:

a dielectric board formed by laminating a plurality of dielectric layers;

a first line conductor formed on a main face of one dielectric layer of the dielectric board;

a second line conductor formed on a main face of another dielectric layer of the dielectric board;

a through conductor for electrically connecting one end of the first line conductor to one end of the second line conductor by piercing the dielectric layers between the first line conductor and the second line conductor;

same plane ground conductors which are formed with a specified space from the first line conductor on the main face of the dielectric layer on which main face the first line conductor is formed and are formed with a specified space from the second line conductor on the main face of the dielectric layer on which main face the second line conductor is formed;

ground conductors formed on the main faces of the dielectric layers between the first line conductor and the second line conductor so as to surround the through conductor; and a plurality of ground through conductors which are formed on the dielectric layers so as to surround the through conductor and which electrically connect the same plane ground conductors and the ground conductors, wherein $L>\lambda/4$ and $\pi(A+B) \leq \lambda$ are satisfied in which
L is a length of the through conductor, A is a diameter of the through conductor, B is shortest distances between the through conductor and the ground through conductors, $\pi$ is a circle ratio and $\lambda$ is an effective wavelength of a high-frequency signal transmitted by the through conductor.

2. The high-frequency wiring board of claim 1, wherein a distance H between the ground conductor and the same plane ground conductor is equal to or less than $\lambda/2$.

3. The high-frequency wiring board of claim 1, wherein a distance P between centers of the ground through conductors is equal to or less than $\lambda/4$.

4. The high-frequency wiring board of claim 2, wherein a distance P between centers of the ground through conductors is equal to or less than $\lambda/4$.

5. The high-frequency wiring board of claim 1, wherein a frequency of the high-frequency signal is within a range from 30 GHz to 100 GHz.

* * * * *